United States Patent
BeSerra et al.

(10) Patent No.: US 11,188,142 B1
(45) Date of Patent: Nov. 30, 2021

(54) POWER MANAGEMENT NETWORK FOR COMMUNICATION BETWEEN RACKS IN A DATA CENTER

(71) Applicant: Amazon Technologies, Inc., Seattle, WA (US)

(72) Inventors: Christopher James BeSerra, Federal Way, WA (US); David Edward Bryan, Seattle, WA (US); Gavin Akira Ebisuzaki, Issaquah, WA (US); Michael Jon Moen, Olympia, WA (US); Roey Rivnay, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/216,545

(22) Filed: Dec. 11, 2018

(51) Int. Cl.
*G06F 1/32* (2019.01)
*G06F 1/3296* (2019.01)
*H05K 7/14* (2006.01)
*G06F 1/3206* (2019.01)

(52) U.S. Cl.
CPC .......... *G06F 1/3296* (2013.01); *G06F 1/3206* (2013.01); *H05K 7/1492* (2013.01); *H05K 7/1498* (2013.01)

(58) Field of Classification Search
CPC ........ G06F 1/3202; G06F 1/3231; G06F 1/26; G06F 1/206; G06F 1/3228; G06F 1/08; G06F 1/3289; G06F 1/266; H04L 12/12; H04L 12/10
See application file for complete search history.

(56) References Cited

U.S. PATENT DOCUMENTS

| | | | | |
|---|---|---|---|---|
| 7,533,281 B2 * | 5/2009 | Hsieh | .................. | G06F 11/00 713/300 |
| 8,600,575 B2 * | 12/2013 | Weston | ............... | G06F 11/3006 700/295 |
| 8,868,936 B2 * | 10/2014 | Nelluri | ................. | G06F 1/3203 713/300 |
| 9,720,476 B1 * | 8/2017 | Nguyen | ................. | G06F 1/263 |
| 9,933,829 B2 * | 4/2018 | Griffith | ................. | H04B 3/546 |
| 2003/0065958 A1 * | 4/2003 | Hansen | ..................... | G06F 1/26 713/300 |
| 2004/0073816 A1 * | 4/2004 | Hansen | ..................... | G06F 1/26 713/300 |
| 2005/0203761 A1 * | 9/2005 | Barr | .......................... | G06F 1/26 713/320 |
| 2006/0047979 A1 * | 3/2006 | Hsu | .......................... | G06F 1/30 713/300 |

(Continued)

*Primary Examiner* — Zahid Choudhury
(74) *Attorney, Agent, or Firm* — Klarquist Sparkman, LLP (57) ABSTRACT

A rules-based mechanism is described for powering down racks in an ordered and autonomous way in a data center. Power shelf controllers (PSCs), on different racks or on the same rack, communicate together through a network, called the PSC network, separate from the data network. The PSCs are aware of the other PSCs that share the same input power domain. When the racks are configured for use, each PSC is assigned a priority value, based upon the management provisioning layer assignment. Each PSC creates a table of all the other PSCs and tracks each assigned priority value. When a power event occurs, the PSC can power down components within the rack in accordance with the priority table. Recovery can also be carried out in conformance with the priority table.

20 Claims, 8 Drawing Sheets

(56) References Cited

U.S. PATENT DOCUMENTS

| | | | |
|---|---|---|---|
| 2008/0178019 A1* | 7/2008 | McGrane | G06F 1/26 713/320 |
| 2008/0178029 A1* | 7/2008 | McGrane | G06F 1/3287 713/324 |
| 2009/0193276 A1* | 7/2009 | Shetty | G06F 11/30 713/340 |
| 2010/0064151 A1* | 3/2010 | Saeki | G06F 1/3296 713/300 |
| 2011/0173468 A1* | 7/2011 | Egan | G06F 1/30 713/320 |
| 2013/0318371 A1* | 11/2013 | Hormuth | G06F 1/28 713/320 |
| 2015/0362972 A1* | 12/2015 | Frick | G06F 1/3287 713/320 |
| 2016/0349812 A1* | 12/2016 | Goh | G06F 11/0793 |
| 2017/0085637 A1* | 3/2017 | Cencini | G06F 1/189 |
| 2017/0264493 A1* | 9/2017 | Cencini | G06F 1/26 |

\* cited by examiner

POWER MANAGEMENT NETWORK FOR COMMUNICATION BETWEEN RACKS IN A DATA CENTER

BACKGROUND

Data centers house a large amount of server, network, and computer equipment to process, store, and exchange data by users of a cloud infrastructure. A computer room of a data center can include many server racks, having multiple server computers, switches and other associated computer equipment.

A large amount of electrical power is required to operate the data center and electrical power is distributed to locations spread throughout the data center. Data centers typically include back-up components and systems to provide back-up power to the servers in the event of a failure of a primary power system. In some data centers, each primary power system may have its own back-up system that is fully redundant at all levels of the power system. For example, in a data center having multiple server rooms, each server room may have its own primary power system and back-up power system. The backup system for each server room may have a switchboard, uninterruptible power supply (UPS), and floor power distribution unit (PDU) that mirrors a corresponding switchboard, uninterruptible power supply, and floor power distribution unit in the primary power system for that server room.

In some instances, it can be necessary to power down server computers in an orderly fashion because a power event (e.g., a power brownout, maintenance, full power outage, etc.). Deciding and implementing how to perform selective power down of data center components has yet to be adequately addressed in data center power solutions.

DETAILED DESCRIPTION

A rules-based mechanism is described for powering down racks in an ordered and autonomous way in a data center. The modern data center includes discrete power domains that are concentrated at a rack, a half-rack level, a quarter-rack level, etc. These racks contain an integrated power system with multiple input power sources, power supplies, automatic transfer switches (ATS), battery backup units, DC power rail, and a power shelf controller (PSC). In previous systems, the batteries and ATS were outside the rack and provided coverage for a defined set of racks. In some situations, the battery coverage is multiplexed across multiple power cells. This structure allowed for a well-defined power layout in the case of a catastrophic event where one or more of the power inputs was disabled. A recent change to move power domains, with integrated ATS and batteries, into a rack requires a new mechanism to make power-down or power reduction decisions. For example, if one of the input power sources is compromised and the data center is oversubscribed for power, then some racks can be put into a low power state or shut off entirely until the input power is restored. The PSC controls each power domain at a rack or half rack level and can make intelligent decisions based on network topology, power usage, and priority.

The PSCs, on different racks or on the same rack, communicate together through a network, called the PSC network, separate from the data network. The PSCs are aware of the other PSCs that share the same input power domain (i.e., they share the same power source). When the racks are configured for use, each PSC is assigned a priority value, based upon the management provisioning layer assignment. For example, a flash storage rack, a rotational media (HDD) storage rack, a security networking rack, a compute rack, and an HPC accelerator rack, may each have a different priority value assigned. Each PSC creates a table of all the other PSCs and tracks each assigned priority value. This table is called the power priority table (PPT). The assigned priority value may change and it is updatable by the provisioning infrastructure. Each PSC can update its PPT at a predetermined frequency. The frequency of the PPT update can vary based on the implementation.

Additional power metrics can include the total capacity of the input power to the room, and the power consumption of each rack. For example, a room may have 1000 units of input power split evenly in 2 power input domains, P1 and P2. Each rack may consume 10-40 units of input power, and each PSC knows this data for the room via communications between the PSCs in a PSC network. In one example, the racks consume 700 units of power and require both input power domains to be fully functional. Each PSC knows the total number of PSCs in its network, which can change in size as a data center room is being built out or scaled down. Each PSC can know the priority of every PSC in its network. If a power event occurs, each PSC examines the nature of the event (power brownout, single input power down, multiple/all input power down, maintenance) and determines if action is required.

A simple example of operation is if the input power P2, from the example above, is removed. If the racks require 700 units of power, and only 500 units of power is available, then each PSC decides if it should go to a lower power state or if it should power off all of its connected servers. Each PSC examines its priority and determines if it should change power state and send notification to all the PSCs on the PSC network of this decision. Each PSC calculates if the power domain reaches a proper state based upon these broadcast messages and PSCs iteratively power down until this state is reached. Each PSC knows which other PSCs are powering down, and in the advent of some number of PSCs that are not able to power down, it continues to power down racks in an orderly manner until a stable power state is reached. This provides coverage for the case when a PSC is not functioning properly. Each PSC continues to monitor the error conditions and changes power state when the power event is resolved so as to autonomously recover from the power event. The provisioning infrastructure can also monitor the PSC network and override any PSC decision, if required, using an API communicated to the PSC.

As used herein, "computer room" means a room of a building in which computer systems, such as rack-mounted servers, are operated. As used herein, "data center" includes any facility or portion of a facility in which computer operations are carried out. A data center may include servers dedicated to specific functions or serving multiple functions. Examples of computer operations include information processing, communications, storage, simulations, and operational control. As used herein, "primary power" means any power that can be supplied to an electrical load, for example, during normal operating conditions. As used herein, "source power" includes power from any source, including but not limited to power received from a utility feed.

Figure 1:
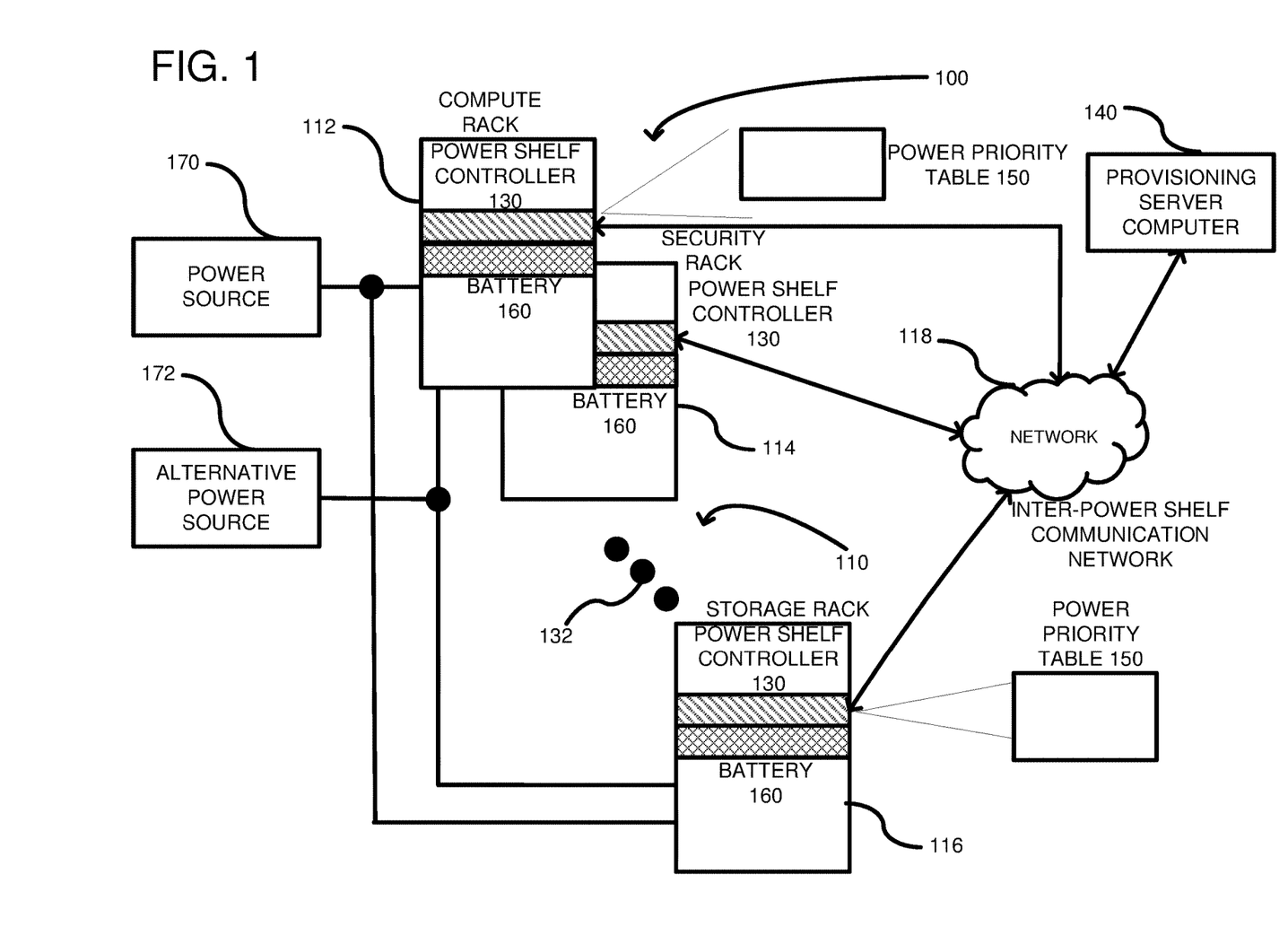
FIG. 1 shows a data center including a plurality of racks including power shelf controllers coupled together through a network.

FIG. 1 is an embodiment of a data center 100 including a plurality of racks, shown generally at 110, including a compute rack 112, a security rack 114 and a storage rack 116. Other rack types can be used. The racks 110 are within a network 118 that couples together PSCs 130 in each rack to allow communication there between. The network 118 of racks 110 can include any number of racks as indicated at 132. The different rack types including the compute rack 112, the security rack 114 and the storage rack 116 illustrates that the racks can have different purposes and correspondingly different importance within the data center 100. Accordingly, in terms of powering down the racks in the event of a power disturbance, the different racks are given different priority based on type. Such priorities can be dictated by a provisioning server computer 140, which is coupled to the network 118 and can communicate with the PSCs 130 on each of the racks 110. At any time, the provisioning server computer 140 can establish or modify the priorities of the racks 110 through an appropriate broadcast message to the racks (e.g., an API). Each rack 110, can store its own priority table 150 indicating how to react in the event of a power disturbance.

As shown, each rack includes the PSC 130 and a battery backup 160. Although not shown, the power shelf of the racks 110 also includes an automatic transfer switch ATS coupled to a primary power source 170 and an alternate power source 172. The primary power source 170 can be, for example, standard power from a power grid, while the alternate power source 172 can be power from a generator or other secondary power source usable if the power source 170 goes down. Additional power sources can be used. As further described below, should a power event disrupt power of either the power source 170 or the alternative power source 172, the PSCs 130 communicate with each other through the network 118 regarding the power event. Additionally, the PSCs 130 make a collective decision about how to power down using their local power priority table 150. The power priority table 150 indicates that some racks should power down before other racks. For example, a security rack 114 can be given priority over a storage rack 116 such that the storage rack powers down its components, either in part or in whole, based on the nature of the event, while the security rack can remain at full power. In yet another alternative, the storage rack 116 can remove itself from using the power source 170 or the alternative power source 172 in favor of using its local battery 160.

Figure 2:
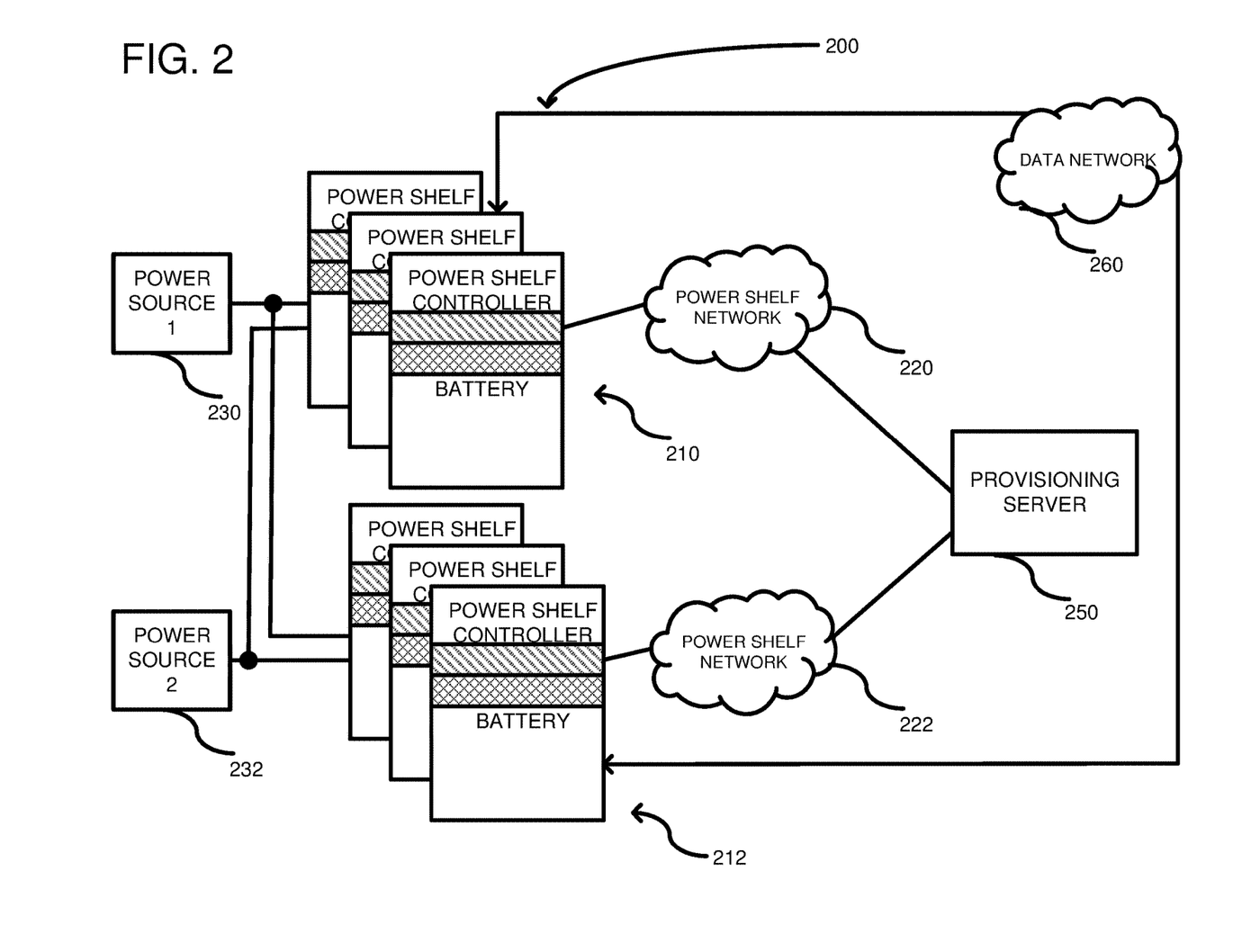
FIG. 2 illustrates a plurality of power shelf controller networks as being separate from a data network in a data center.

FIG. 2 shows a data center 200 that includes multiple groups of racks 210, 212 coupled together through their own respective power shelf network 220, 222. FIG. 2 illustrates that each group 210, 212 can communicate with other PSCs within the same group but cannot necessarily communicate directly with PSCs in different groups. The groupings of the racks 210, 212 can be based on power sources 230, 232 that are shared amongst the group. Although only two groups, 210 and 212, are shown, the data center 200 typically includes additional groups and additional power shelf networks coupling together PSCs within those groups. A provisioning server 250 can supply updates to each group 210, 212 regarding how to respond to power events. As shown at 260, a data network (e.g., a customer network, user network, etc.) is separate from each of the power shelf networks 220, 222. In this way, customers or other users of a data center can use components (e.g., servers) within the racks 210, 212, without impacting the power shelf networks 220, 222. The power shelf networks 220, 222 can be segregated networks that are physically not connected to the data network 260. Alternatively, the power shelf networks 220, 222 can be virtual networks that are logically isolated from the data network 260. A wide variety of configurations can be used in terms of the structure of the data network 260.

Figure 3:
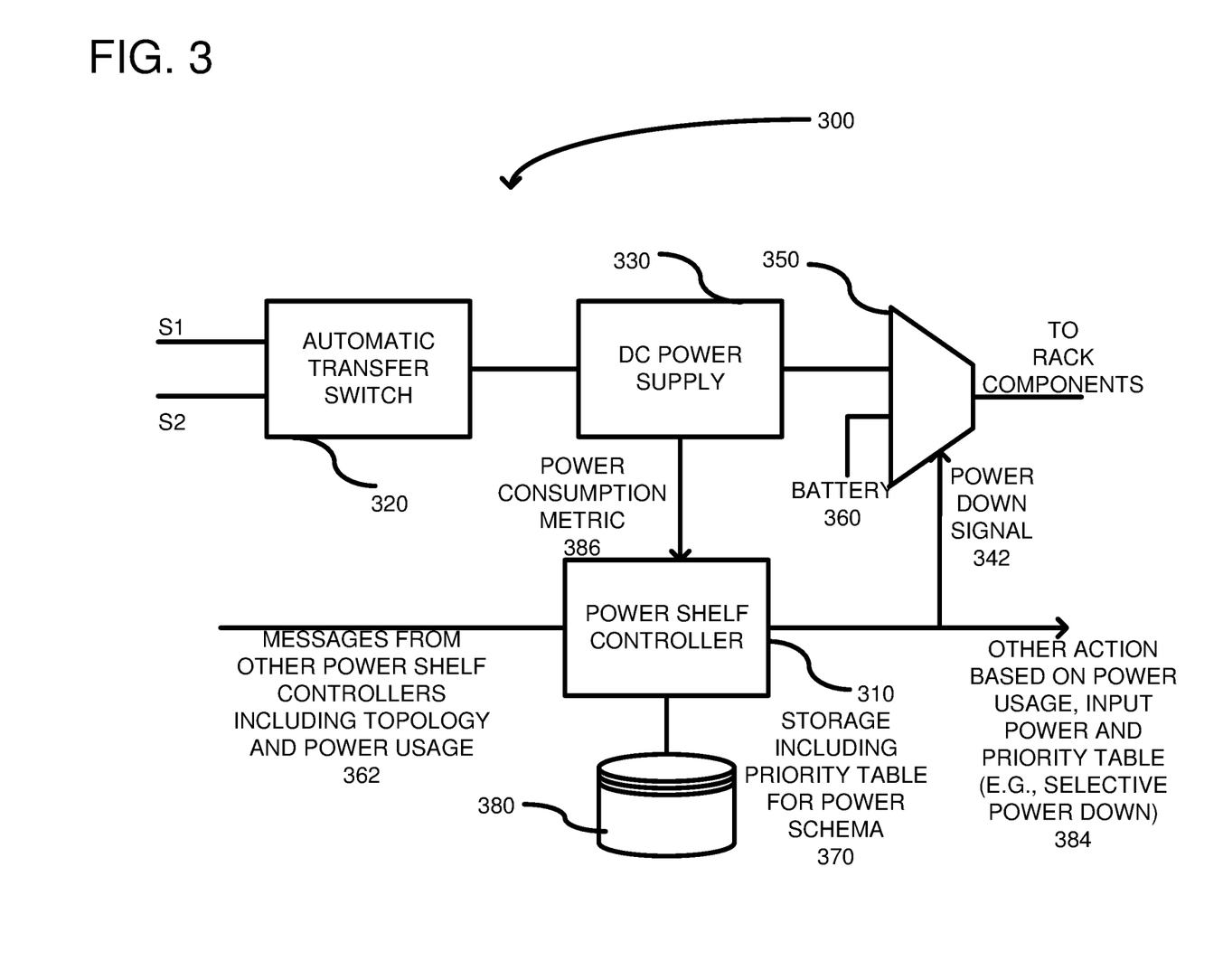
FIG. 3 shows detailed hardware components within a power shelf controller of FIG. 1.

FIG. 3 shows further details of a power shelf 300 within a rack. The power shelf 300 includes a PSC 310 similar to the PSCs 130 of FIG. 1. An ATS 320 receives power from two different power sources, S1 and S2, which can be sources 170, 172 of FIG. 1. An output of the ATS 320 is coupled to a DC power supply 330 that receives AC power as an input and supplies a DC power signal designed to power components within a rack. The PSC 310 controls a power down signal 342 supplied to a select line of a multiplexor 350. Based on the signal 342 the multiplexor switches between the DC power supply 330 and a battery backup 360. The PSC 310 can receive messages 362 from other PSCs on the power shelf network (e.g., 220 from FIG. 2). The messages can include metrics associated with other PSCs in the network and power usage information associated with other racks in the network. The messages can include a unique identifier associated with a power shelf controller, a maximum power associated with the power shelf controller, an actual power being used by the portion of the rack associated with the power shelf controller, a priority level, etc. Such messages can be used to generate a priority table 370 associated with a power schema that describes to the PSC 310 how to take action based on a power event or a power recovery. The priority table 370 can be stored in a database 380 and programmed by an administrator, which can deliver the priority table to the power shelf controllers using the provisioning server computer 140. The power shelf controllers can additionally modify or update their own tables autonomously by analyzing real-time data during a power down cycle. Examples of actions that can be taken by the PSC 310 include generating the power down signal 342, which switches the rack to the battery backup 360, or other action as shown at 384 which can include powering down individual components within the rack so as to reduce overall power consumption. Any reduction in power can be read directly from the DC power supply 330 as shown by the power consumption metric 386. The PSC 310 can then transmit a message to the other PSCs in its network describing the current power consumption of its rack. It should be noted that the ATS 320 can be removed from the rack if desired. In such a case, a single power line (e.g., S1) can be coupled directly to the DC power supply 330.

Figure 4:
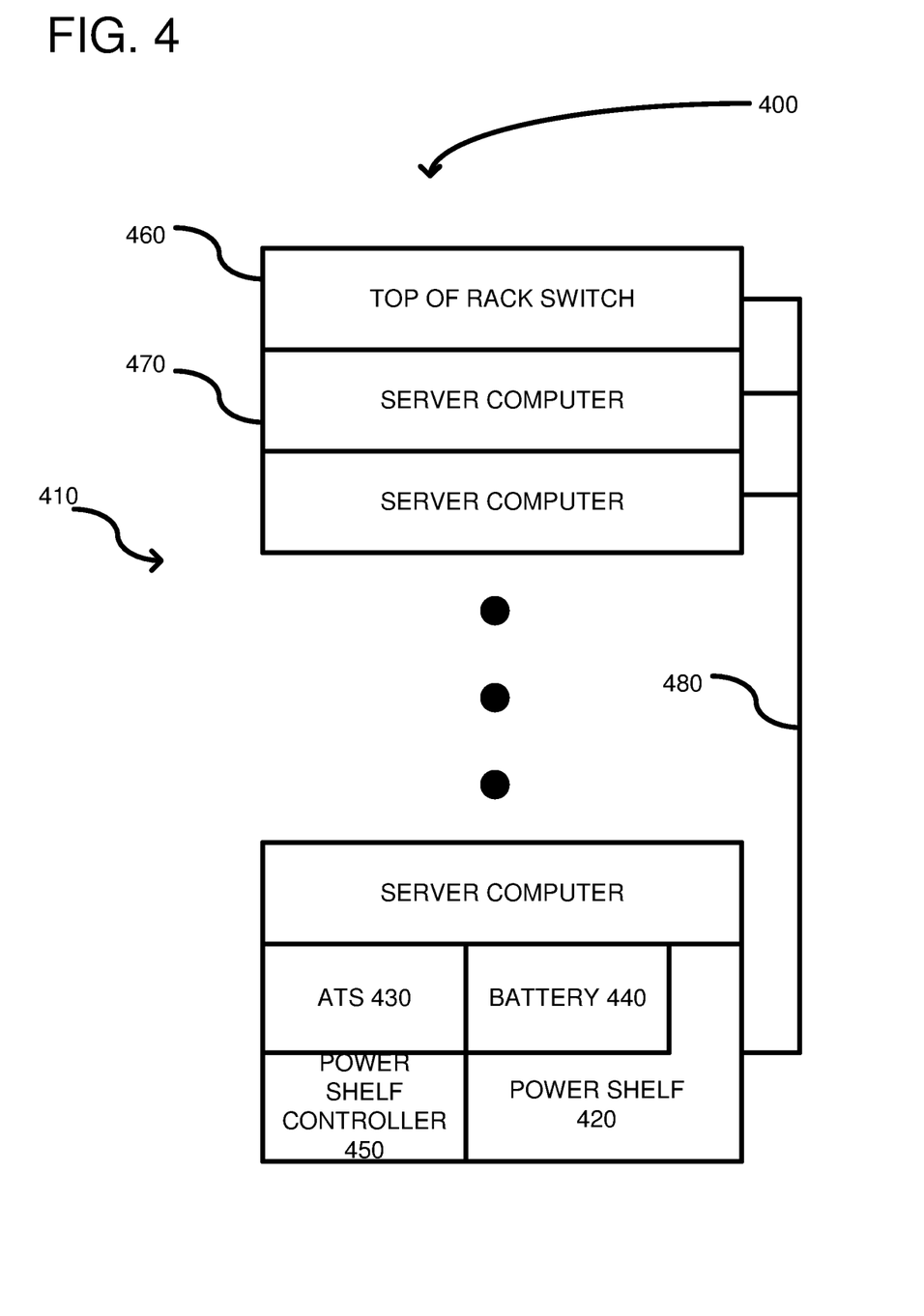
FIG. 4 shows an example rack including a plurality of server computers and a power shelf.

FIG. 4 is an example rack 400 including a plurality of hardware components, shown generally at 410, and a power shelf 420 including power related components, such as an ATS 430, a battery backup 440, and a PSC 450, which can be an Integrated Circuit (IC). The components 410 can include one or more server computers 470, and one or more switches, such as switch 460. A power bus 480 extends from the power shelf to the components 410 to provide power to the components. As described above, the PSC 450 can control the power bus 480 so as to selectively power down the components 410 in accordance with the priority table. For example, some of the components 410 can be more power intensive than other components. As a result, the PSC 450 can choose to power down the more power intensive components. Other metrics can also be analyzed for deciding priority, such customer-based metrics, power levels, etc. If desired, the PSC 450 can switch power so as only to use the battery 440 and not use power from the ATS 430. In this way, the rack 400 can be independent of the other racks in terms of power usage.

Figure 5:
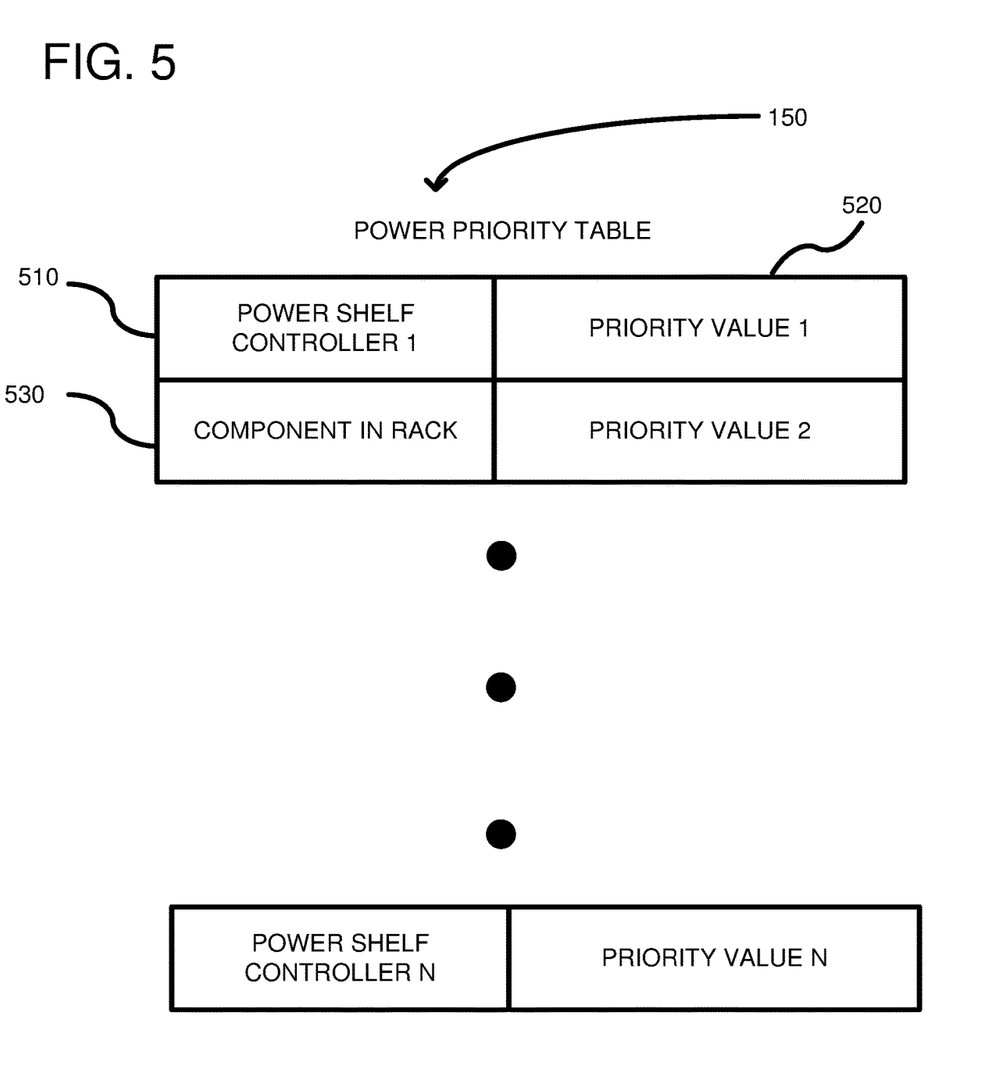
FIG. 5 shows a priority table for powering down components within a rack.

FIG. 5 is an example of the power priority table 150. In this example, each PSC is listed as one field in a row of the table. For example, as shown at 510, a first field in the table 150 includes an identifier of a PSC. A second field 520 includes a priority value assigned to that PSC. As shown at 530, the power priority table can also identify components within a rack associated with the PSC identified in field 150. Thus, a component identified in field 530 can have a higher priority than other components in the same rack. In this way, the PSC in field 510 can selectively power down individual components within the rack in accordance with the power priority table. Priority values in the priority table can be, for example, integer values (e.g., 1-100), or floating-point values. Priority values can be assigned based on whether a component includes customer data. Thus, a non-customer occupied component could be given a low priority and be more readily powered down. Priority can further be based on an analysis of which services running on the components are more important. For example, components running a "mission-critical" service can have a higher priority than components running a service that is only occasionally used. Additionally, each PSC can autonomously decide how to proceed with power down and recovery due to a power event. For example, additional instructions from a provisioning server computer 140 (FIG. 1) are not needed in the case of a power event. The priority table represents a power-down schema for powering down components in the rack is an ordered fashion, wherein some components can remain powered on if they are a higher priority. The priority table also provides a recovery schema for powering back up the components. The priority table can include other fields, such as a type of power event (e.g., brownout, multiple input power down, etc.), and/or an action field describing an associated action to take, such as a graceful power down, wherein servers are notified to store data because a shutdown is imminent.

Figure 6:
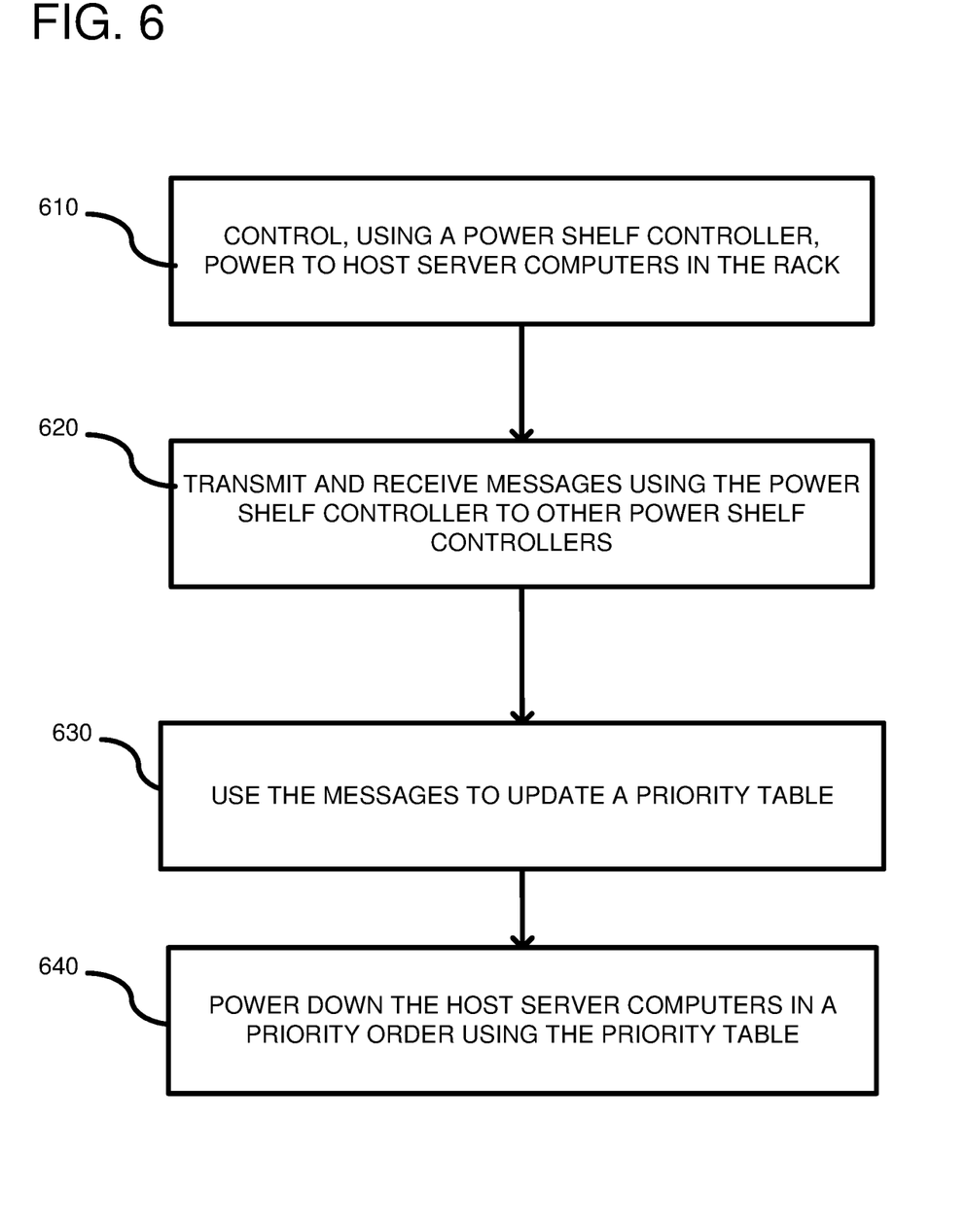
FIG. 6 is a flowchart according to one embodiment for communicating power information between power shelf controllers in a data center.

FIG. 6 is a flowchart according to one embodiment for controlling power in a data center. In process block 610, a PSC can control power to one or more host server computers in a rack. For example, turning to FIG. 3, a power down signal 342 supplied by the PSC 310 can control whether the multiplexor 350 outputs power from the DC power supply 330 or the battery backup 360. In other embodiments, selective power down of components can be used. In process block 620, the PSC transmits and receives messages to other PSCs. For example, turning to FIG. 1, the PSCs 130 can communicate through the network 118 so as to update each of the other PSCs as to a state of each rack and any metrics associated with power in the rack. In process block 630, the messages can be used to update a priority table. For example, in FIG. 1, the priority table 150 can be updated to include new power related metric data. In process block 640, the power shelf controller can power down the host server computers in a priority order using the priority table. For example, at any point in time, a PSC can receive a message from one or more other PSCs that there is a power problem with one or more of the power sources. In such a case, the PSC can determine how to respond to the power problem using the priority table, such as table 150 in FIG. 1. In some cases, the PSC can determine to switch to the battery backup based on the power event. In other cases, the PSC can determine that it has priority in terms of maintaining power and allows other racks to power down first. For example, in FIG. 1, the security rack 114 can be given priority over other rack types, such as the storage rack 116. In such a case, the priority table 150 indicates that the storage rack should power down before the security rack so that the security rack can stay active as long as possible. In some cases, the power sources supply a reduced power and the PSCs can selectively power down server computers within a rack until a desired power level is reached. For example, after the PSC powers down some of its associated hardware components, it can transmit a current power level obtained from the DC power supply (see FIG. 3, power consumption metrics 386) and the PSCs on the network can make a determination collectively whether further power down is needed. Once the desired power level is reached, the PSCs can wait for a power recovery. As the recovery occurs, the PSCs can use the priority table to power backup components within the rack in a priority order.

Figure 7:
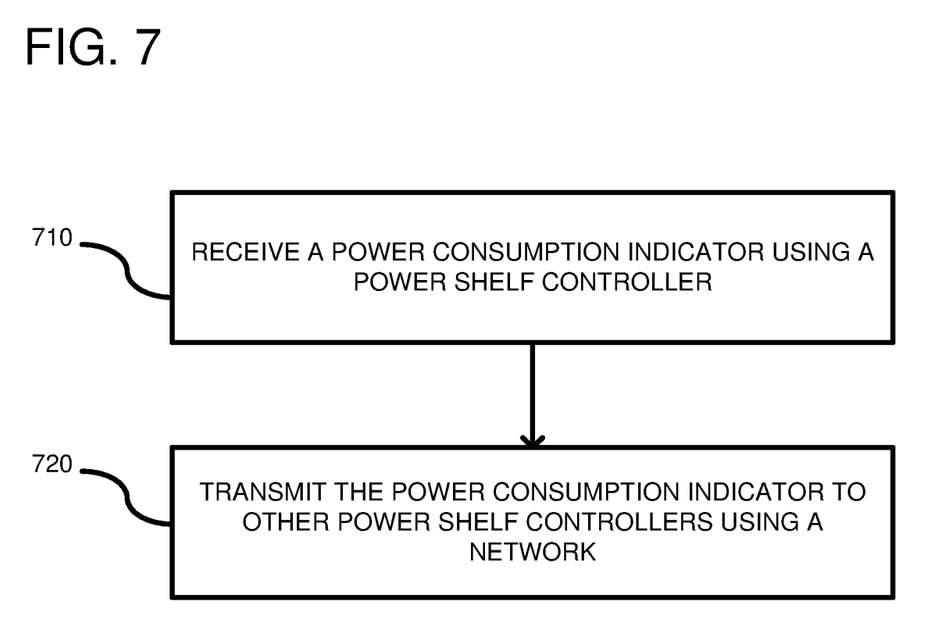
FIG. 7 is a flowchart according to another embodiment for communicating power information between power shelf controllers in a data center.

FIG. 7 is a flowchart according to another embodiment wherein a power consumption indicator, which can be a metric or other indicator is received in a PSC. For example, turning to FIG. 3, a power consumption metric 386 is received in the PSC 310. The power consumption metric 386 is a measure of power currently being used by a rack in which the PSC resides. Although the power consumption metric is shown as being supplied by the DC power supply 330, it can be obtained through other components such as a current measuring device in series with the DC power supply. Other power consumption techniques can be used depending on the particular implementation. In process block 720, the power consumption indicator is transmitted to other PSCs using a network. For example, in FIG. 2, the PSCs in group 210 can communicate with each other through the network 220. The PSCs can further communicate when a power event occurred, such as a power brownout, a room power down in a data center, a maintenance power down, or a multiple input power down.

Figure 8:
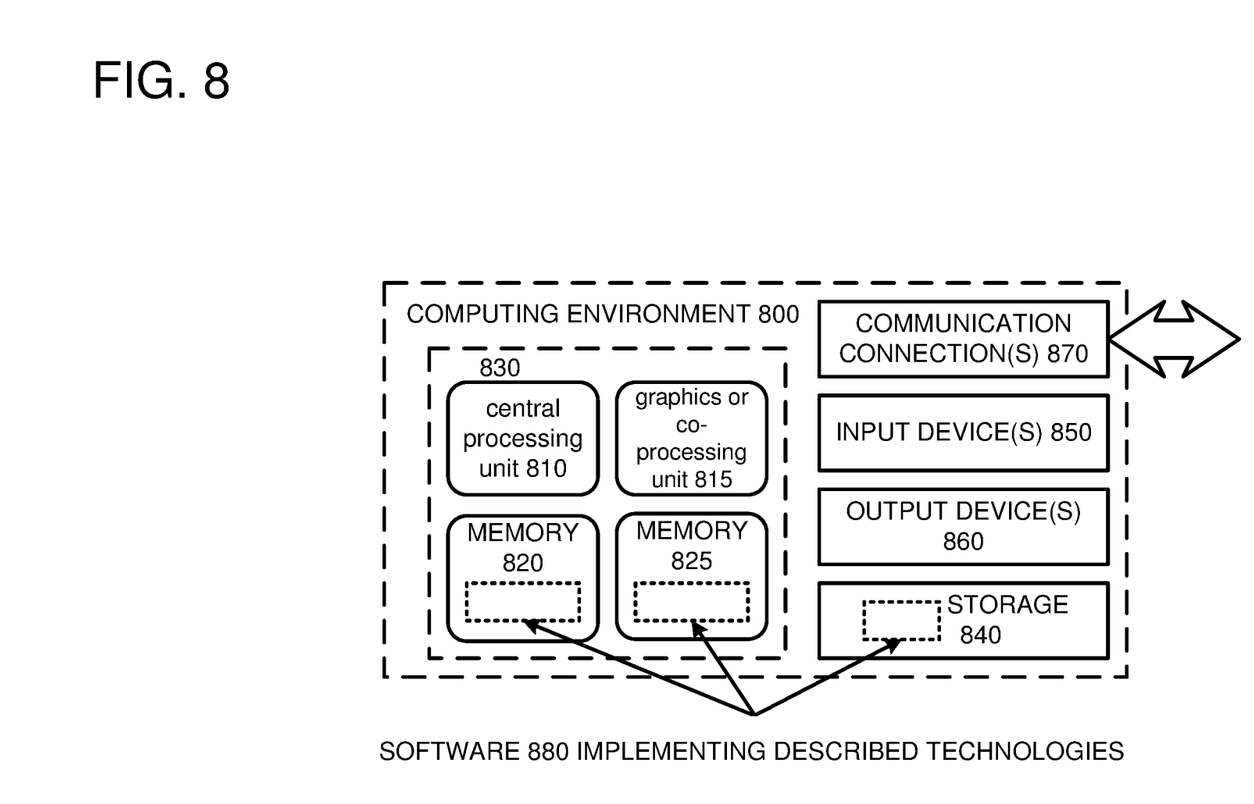
FIG. 8 depicts a generalized example of a suitable computing environment in which the described innovations may be implemented.

FIG. 8 depicts a generalized example of a suitable computing environment 800 in which the described innovations may be implemented. The computing environment 800 is not intended to suggest any limitation as to scope of use or functionality, as the innovations may be implemented in diverse general-purpose or special-purpose computing systems. For example, the computing environment 800 can include components that are part of the PSC.

With reference to FIG. 8, the computing environment 800 includes one or more processing units 810, 815 and memory 820, 825. In FIG. 8, this basic configuration 830 is included within a dashed line. The processing units 810, 815 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 8 shows a central processing unit 810 as well as a graphics processing unit or co-processing unit 815. The tangible memory 820, 825 may be volatile memory (e.g., registers, cache, RAM), non-volatile memory (e.g., ROM, EEPROM, flash memory, etc.), or some combination of the two, accessible by the processing unit(s). The memory 820, 825 stores software 880 implementing one or more innovations described herein, in the form of computer-executable instructions suitable for execution by the processing unit(s).

A computing system may have additional features. For example, the computing environment 800 includes storage 840, one or more input devices 850, one or more output devices 860, and one or more communication connections 870. An interconnection mechanism (not shown) such as a bus, controller, or network interconnects the components of the computing environment 800. Typically, operating system software (not shown) provides an operating environment for other software executing in the computing environment 800, and coordinates activities of the components of the computing environment 800.

The tangible storage 840 may be removable or non-removable, and includes magnetic disks, magnetic tapes or cassettes, CD-ROMs, DVDs, or any other medium which can be used to store information in a non-transitory way and which can be accessed within the computing environment 800. The storage 840 stores instructions for the software 880 implementing one or more innovations described herein.

The input device(s) 850 may be a touch input device such as a keyboard, mouse, pen, or trackball, a voice input device, a scanning device, or another device that provides input to the computing environment 800. The output device(s) 860 may be a display, printer, speaker, CD-writer, or another device that provides output from the computing environment 800.

The communication connection(s) 870 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, aspects of the disclosed technology can be implemented by software written in C++, Java, Perl, any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present, or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

What is claimed is:

1. A method of controlling power in a data center, comprising:

controlling, using a power shelf controller within a rack, power to a plurality of server computers;

transmitting and receiving messages using the power shelf controller to other power shelf controllers in other racks in the data center, wherein the messages include power information associated with the rack;

using the messages to update a priority table that describes how to power down the plurality of server computers, wherein the priority table is created in the power shelf controller and the priority table includes information of the other power shelf controllers in other racks, and each of the other power shelf controllers in other racks includes its own priority table;

powering down, under control of the power shelf controller, the plurality of server computers in a priority order using the priority table; and updating the priority table, autonomously, using the power shelf controller based upon real-time power data received while powering down the plurality of server computers.

2. The method of claim 1, further including:

storing the priority table accessible by the power shelf controller, the priority table providing a power-down schema;

receiving a message in the power shelf controller that there is a power problem with a power source;

determining, by the power shelf controller, how to respond to the power problem using the priority table; and switching to a battery based on the determination.

3. The method of claim 1, wherein the power shelf controller and the other power shelf controllers are coupled together through a network, separate from a data network.

4. The method of claim 1, wherein the power shelf controller controls only a portion of server computers in the rack, and a separate power shelf controller within the rack controls another portion of server computers the rack.

5. The method of claim 1, wherein the power shelf controller monitors power consumption of the rack and wherein the power information includes a metric related to the power consumption.

6. The method of claim 1, further including:

detecting that power from a power source has been disrupted, and selectively reducing power to components in the rack;

detecting that power from the power source has returned to normal operation and selectively increasing power to the components in the rack under control of the power shelf controller.

7. An apparatus, comprising:

a power shelf controller including an Integrated Circuit (IC), the power shelf controller configured to be coupled to components in a server rack;

wherein the power shelf controller is configured to communicate with other power shelf controllers coupled to components in different server racks to exchange metrics relating to power usage including actual power usage of the server rack, wherein the power shelf maintains a priority table that indicates an order in which to power down the components in the server rack when power is lost and an order in which to power back up the components when a power recovery occurs; and wherein the priority table is created in the power shelf controller and the priority table includes information of the other power shelf controllers in the different server racks, and each of the other power shelf controllers in the different server racks includes its own priority table.

8. The apparatus of claim 7, further including an Automatic Transfer Switch (ATS) positioned within each rack, the ATS having multiple inputs for receiving different power sources and an output coupled to a DC power supply.

9. The apparatus of claim 7, further including storage within each rack configured to store a priority table that the power shelf controller is configured to follow to reduce power consumption.

10. The apparatus of claim 7, wherein the power shelf controller is configured to read a power consumption metric and wherein the metrics that are passed to the power shelf controller include the power consumption metric.

11. The apparatus of claim 7, further including a multiplexer having a first input coupled to a DC power supply in the rack, a second input coupled to a battery backup, and a select line coupled to the power shelf controller, which is configured to control the select line based on the metrics.

12. The apparatus of claim 7, wherein the power shelf controller is configured to selectively power down the components in accordance with a priority table after a detection is made that a power event has occurred.

13. The apparatus of claim 12, wherein the power shelf controller is configured to perform the selective power down based on a type of power event, wherein the types of power events include: a power brownout, a room power down in the data center, a maintenance power down, or a multiple input power down.

14. The apparatus of claim 12, wherein the power shelf controller is configured to selectively power up the components in accordance with the priority table after a determination is made that power to the rack has returned to a previous state prior to the power event.

15. The apparatus of claim 7, wherein the components in the rack include a plurality of server computers that are powered by a DC power supply in the rack.

16. The apparatus of claim 7, wherein the power shelf controller is configured to power down the components in a priority order until a stable power state is reached.

17. A method, comprising:

receiving a power consumption indicator in a first rack using a first power shelf controller;

transmitting, from the first power shelf controller, the power consumption indicator to other power shelf controllers in different racks using a network, different than a data network, which couples together the first power shelf controller with the other power shelf controllers for communication there between;

updating, by the power shelf controller, a priority table based upon the received power consumption data and using the priority table in a power down sequence of components in the first rack; and wherein the priority table is created in the first power shelf controller and the priority table includes information of the other power shelf controllers in the different racks, and each of the other power shelf controllers in the different racks includes its own priority table.

18. The method of claim 17, further including detecting, using the first power shelf controller, a power event including a reduction in available power, and using a priority table and using power-related metrics shared between the first power shelf and the other power shelf controllers to reduce power in the first rack.

19. The method of claim 18, wherein the rack includes host server computers coupled to the data network.

20. The method of claim 18, further including detecting, using the first power shelf controller, that the power event has ended, and returning the first rack to a power state prior to the power event using the priority table.

* * * * *